United States Patent [19]

Araki et al.

[11] Patent Number: 4,618,877

[45] Date of Patent: Oct. 21, 1986

[54] POWER SEMICONDUCTOR DEVICE WITH MESA TYPE STRUCTURE

[75] Inventors: Youichi Araki, Yokohama; Yoshinari Uetake, Sagamihara, both of Japan

[73] Assignee: Kabushiki Kaisha Toshiba, Tokyo, Japan

[21] Appl. No.: 682,838

[22] Filed: Dec. 18, 1984

[30] Foreign Application Priority Data

Dec. 21, 1983 [JP] Japan .................. 58-239644

[51] Int. Cl.⁴ ............................... H01L 29/06
[52] U.S. Cl. ...................... 357/56; 357/79; 357/38; 357/68; 357/65; 29/591
[58] Field of Search .......... 357/56, 55, 38, 79, 357/36, 68, 65; 29/571

[56] References Cited

U.S. PATENT DOCUMENTS 4,156,963  6/1979  Tsuji .................................. 357/79
4,246,596  1/1981  Iwasaki ............................. 357/56

FOREIGN PATENT DOCUMENTS 53-12270  2/1978  Japan ................................ 357/79
54-57976  5/1979  Japan .

Primary Examiner—Andrew J. James
Assistant Examiner—Mark Prenty
Attorney, Agent, or Firm—Finnegan, Henderson, Farabow, Garrett & Dunner

[57] ABSTRACT

A mesa type power semiconductor device comprising a mesa groove disposed on the bottom thereof with separated gate electrodes leaving the central portion of the groove bottom free from a gate electrode. This construction is effective in preventing occurrence of an insulator breakdown between a cathode and a gate electrode.

5 Claims, 5 Drawing Figures

POWER SEMICONDUCTOR DEVICE WITH MESA TYPE STRUCTURE

BACKGROUND OF THE INVENTION (a) Field of the Invention

The present invention relates to a compression bonded 3 type power semiconductor device in which a plurality of electrodes formed in a mesa type structure and a thermal buffer plate are pressed together and, more particularly, to a large-current high-speed switching power semiconductor device such as, for example, a multicathode-structure gate-turn-off thyristor or a multiemitter-structure power transistor.

(b) Description of the Prior Art

A high speed switching high power transistor and gate turn-off thyristor (hereinafter abbreviated to as "a GTO") are, in general, formed in a mesa type structure such that a multiemitter structure or a multicathode structure is made on the cathode side surface of an element by dividing the electrodes of a current pickup side.

A semiconductor device having such a mesa type surface structure tends in general to require a sophisticated manufacturing technique as compared with a planar type semiconductor device and to feasibly cause a defect since the semiconductor device is utilized under severe conditions.

Since the GTO is particularly utilized under severe conditions, compared to a power transistor, and a method for manufacturing the GTO requires a more sophisticated manufacturing technique than the power transistor, the GTO must be improved in the structure of its semiconductor element and in the method for manufacturing the semiconductor device.

FIG. 1 is a vertical sectional view of the essential portion of a power semiconductor device formed by a conventional GTO in which the cathode side structure of its semiconductor element is enlarged. In FIG. 1, the conventional GTO has a P-type emitter layer 1 forming the anode side surface of the GTO, an N-type base layer 2 formed in contact with the emitter layer 1, a P-type base layer 3 and an N-type emitter layer 4. In the GTO, the N-type emitter layer 4 forms the cathodes side surface of the GTO and is projected from the surface of the P-type base layer 3 to form a mesa type. The bottom of the mesa type slot formed in the emitter layer 4 is formed by the P-type base layer 3, and a gate electrode 5 made of aluminum is formed on the surface of the bottom of the groove, i.e., on the surface of the layer 3. Further, the layers emitter 4 are formed at both sides of the groove, and the outer surface of the emitter layer 4 as well as both sides of the groove are covered with insulating films 6. An insulator 7 such as polyimide is filled in the groove, and the electrode 5 is thickly covered with the insulator 7.

A cathode electrode 8 made of aluminum is formed on the emitter layer 4, and contacted on its surface with a thermal buffer plate 10 made of molybdenum Mo. Further, a cathode plate 11 made of copper is disposed on the back surface of the plate 10 in such a manner that the plate 11 constitutes part of an enclosure (not shown).

On the other hand, a thermal buffer plate 12 made of tungsten W is bonded to and alloyed with the surface of the emitter layer 1 (or the anode side surface of the GTO), and an anode plate 13 made of copper forming part of the enclosure is pressed on the other surface of the plate 12.

The conventional power semiconductor device shown in FIG. 1, however, is accompanied with a problem that a short circuit frequently occurs between the gate electrode 5 and the cathode after manufacturing or during use, thereby causing the semiconductor device to be lost in its reliability.

The following fact was observed as a result of the inventors' research for the causes of an insulation breakdown in such a power semiconductor device.

As shown in FIG. 1, the width of a groove formed in the emitter layer 4 is in general approx. 600 microns, while the depth of the groove is extremely shallow such as approximately 20 microns. The thermal buffer plate (having a thickness of approximately 50 microns) 10 superposed through the cathode electrode 8 on the groove is pressed toward the groove by high pressure from the cathode plate 11 made of copper, which is relatively collapsible or deformable. This high pressure compression is necessary to obtain a sufficient heat dissipation and electrical conductivity effects from the plate 10. However, the central portion for covering the groove of the plate 10 is deformed by the high pressure compression and intruded into the groove with the result that the intruded portion is pressed into the insulator 7 in the groove, thereby causing an insulator breakdown. Further, even if the plate 10 is not intruded into the insulator 7 in the groove, an insulator breakdown might arise in a thin portion due to irregular thickness of the coating of the insulator 7. Moreover, the insulator breakdown might also occur owing to the same reason, if the thickness of the gate electrode 5 is irregular. In addition, a projection or burr might be produced on the surface of the thermal buffer plate 10 when manufacturing and handling the plate 10. If this projection exists at the center of the groove, the projection is penetrated into the insulator 7 by the above-described compression, thereby causing a deterioration in the insulator, resulting in a short circuit between the cathode and the gate.

SUMMARY OF THE INVENTION

Therefore, the present invention has been made in consideration of the phenomenon that an interval between the thermal buffer plate in the vicinity of the central portion of a gate electrode 5 and the bottom of a mesa groove tend to narrow in a conventional semiconductor device so that an insulator breakdown feasibly occurs in the vicinity of the central portion of the groove, and has for its object to provide a power semiconductor device which is free from a short circuit defect as in the conventional semiconductor device.

According to an aspect of the present invention, there is provided a power semiconductor device of a mesa type structure having a semiconductor element surface formed with a mesa type groove, and a gate electrode formed on the bottom of the groove and covered on its exposed surface with an insulator, wherein said electrode is divided into two and spaced apart to be disposed only at both peripheries of the groove bottom, and an insulator is filled between the spaced electrodes.

DETAILED DESCRIPTION OF THE PREFERRED EMBODIMENTS

Figure 1:
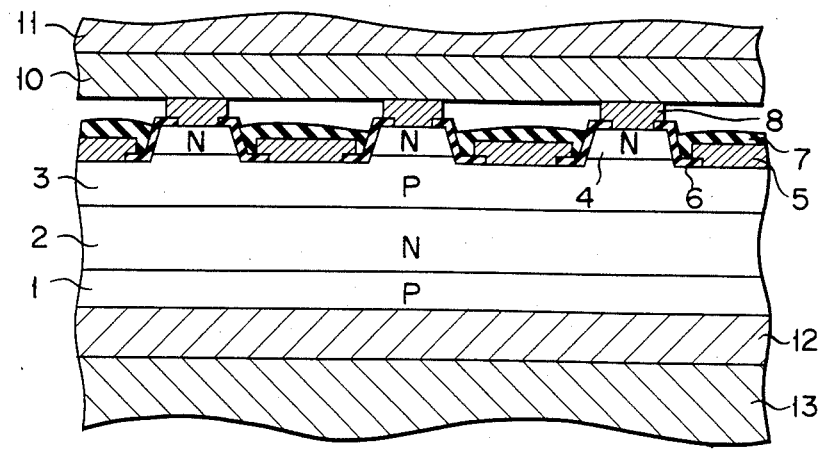
FIG. 1 is a sectional view showing a main portion of a conventional power semiconductor device.
Figure 2:
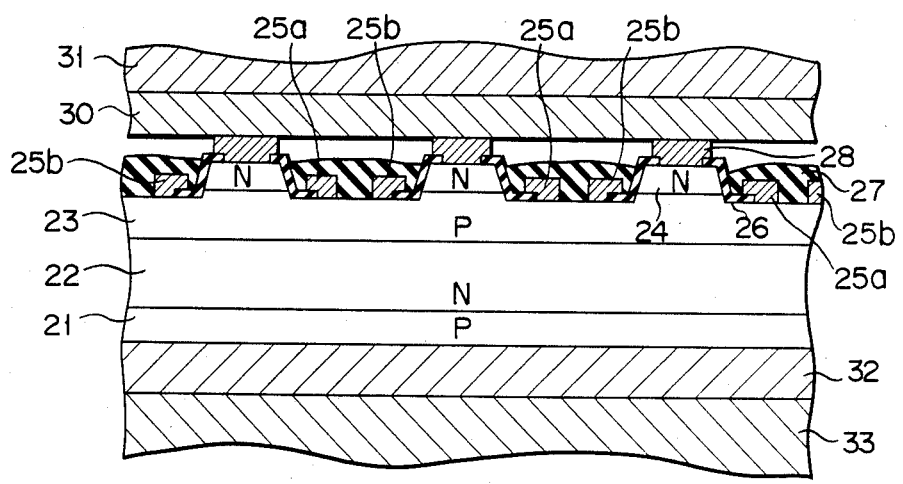
FIG. 2 is a sectional view showing a main portion of a power semiconductor device according to an embodiment of the present invention.

FIG. 2 is a sectional view showing a main portion of a power semiconductor device, illustrating an example applied with the present invention to a GTO, similar to FIG. 1 except the constructional difference of a gate electrode formed in the bottom of a groove.

In FIG. 2, the power semiconductor comprises a P-type emitter layer 21 forming the anode side surface of a GTO, an N-type base layer 22 formed in contact with the emitter layer 21, a P-type base layer 23 and an N-type emitter layer 24. The emitter layer 24 forms a cathode side surface of the GTO, and is projected from the surface of the base layer 23 to form a mesa shape. The bottom of the mesa formed in between the layer emitters 24 is constituted by the base layer 23, and gate electrodes 25a and 25b made of aluminum are disposed on the surface of the layer 23 and spaced apart to be disposed only at both peripheries of the groove bottom, leaving the central portion of the groove bottom free from the gate electrode material 1.

Both side surfaces of the groove are formed of the N-type layer. The outer surface of the layer 24 and both sides of the groove are covered with an insulating film 26. An insulator 27 such as polyimide resin is filled in the groove. The gate electrodes 25a and 25b are thickly covered with the insulator 27, and the insulator 27 is thickly filled in the space between the gate electrodes 25a and 25b.

A cathode electrode 28 made of aluminum is formed on the layer 24, and a thermal buffer plate 30 made of molybdenum Mo is contacted on the electrode 28. Further, a cathode plate 31 made of copper and constituting part of a housing (not shown) is disposed on the back surface of the thermal buffer plate 30.

On the other hand, a thermal buffer plate 32 made of tungsten W is bonded to and alloyed with the surface of the P-type emitter layer 21 (or the anode side surface of the GTO), and an anode electrode 33 made of copper and forming part of the housing is pressed to contact the other side surface of the thermal buffer plate 32.

According to the GTO shown in FIG. 2, the gate electrode is formed of two portions only disposed at both peripheries of the mesa groove bottom, and no electrode is provided in the center of the groove bottom. Thus, a short circuit due to the gate electrode does not substantially occur in the center of the groove. Since the thickness of the insulator 27 in the center of the groove is much larger than that of the conventional device, relative insulating withstand strength in the center of the groove can be much increased, compared to the conventional device.

Figure 3:
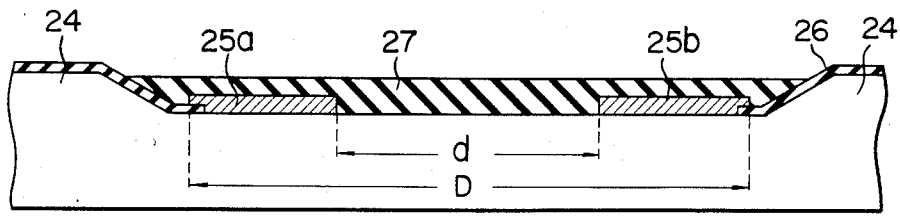
FIG. 3 is a partly enlarged sectional view of FIG. 1.
Figure 4:
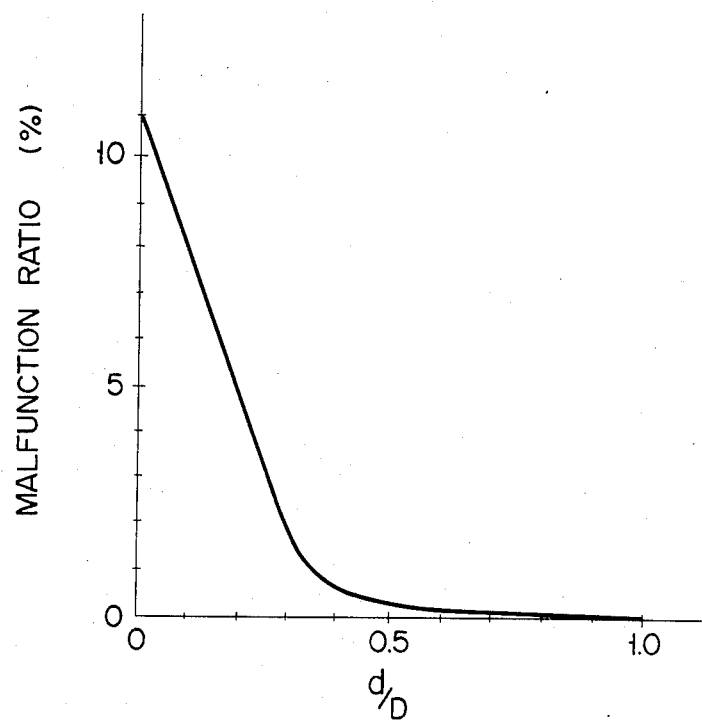
FIG. 4 is a graphic diagram showing the relationship between a spacing distance of gate electrodes and a malfunction occurrence ratio.

FIG. 4 shows a graphical diagram illustrating the results of the influence of d/D to a malfunction occurrence ratio due to a short circuit between the gate and the cathode as an example of a GTO constructed as described above, and typically shown in FIG. 3 in which the width of the groove in the mesa type emitter 24 is approximately 600 microns and the depth is approximately 20 microns, where D represents a distance between the outside edges of the gate electrodes 25a and 25b, and d represents a distance (an interval) between the inside edges.

As apparent from the above results in FIG. 4, there is a correlation between the malfunction occurrence ratio and the ratio d/D of the spacing distance of the gate electrodes. In case of d/D≦0.3, the malfunction occurrence due to the short circuit between the gate and the cathode abruptly decreases (e.g., 1/7 or less as compared with that of the conventional device).

However, though not evident from FIG. 4, in case d/D≧0.5, resistance to a gate current increases to become unreferable in practice. Therefore, it is preferable that the ratio d/D is in a range of 0.3≦d/D≦0.5.

Figure 5:
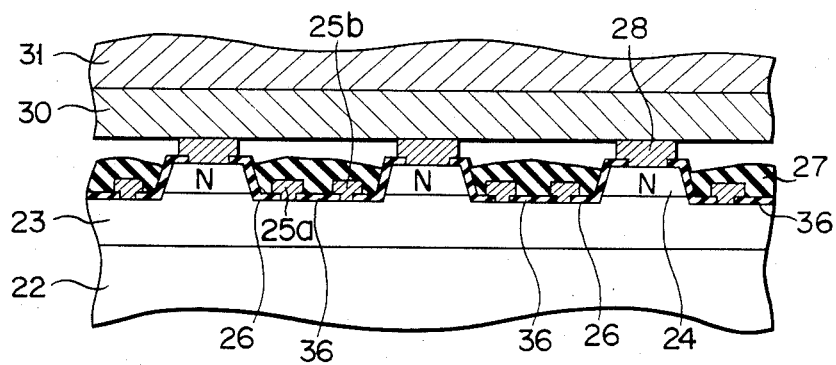
FIG. 5 is a sectional view showing a main portion of a power semiconductor device according to another embodiment of the present invention.

FIG. 5 shows another embodiment of the present invention, in which the insulation is further strengthened at the center of the groove by covering the groove bottom between the gate electrodes 25a and 25b (i.e., the surface of the P-type base layer 23) with an insulating film 36 such as a $SiO_2$ film or a $Si_3N_4$ film.

According to the invention, the semiconductor device improved, as described above, has no gate electrode in the center of the groove. In the semiconductor device of the invention, the gate electrode is not disposed in the center of the groove, so an insulation breakdown does not substantially occur in the center of the groove, with the result that the thickness of the layer of the insulator 27 can be increased in the center of the groove, with the result that even if a projection produced on the thermal buffer plate 30 is, for example, intruded into the insulator 27, no short circuit occurs between the gate and the cathode. Further, even if the thickness of the layer of the insulator 27 is irregular, a short circuit between the gate and the cathode does not substantially occur. Consequently, the reliability of the semiconductor device can be improved, and the manufacturing yield of the semiconductor device can be largely improved, and the manufacturing cost can be reduced.

In the embodiments described above, the GTO has been described. However, the present invention is not limited to those particular embodiments. For example, the present invention may be applied to other power semiconductor devices of a power transistor and mesa type surface structure.

What is claimed is:

1. A power semiconductor device of mesa type structure having a semiconductor element surface formed with a mesa type groove and a gate electrode formed on the bottom of the groove and covered on an exposed surface thereof with an insulator, wherein
said electrode is divided into two and spaced apart to be disposed only at both peripheries of the groove bottom, and an insulator is filled between the spaced electrodes.

2. The power semiconductor device according to claim 1, wherein an insulating film is formed in the groove bottom between the spaced electrodes, and said insulator is filled thereon.

3. The power semiconductor device according to claim 1, wherein the electrodes are spaced apart so that d/D falls between 0.3 and 0.5, where D represents an interval between the outside edges of the spaced electrodes and d represents an interval between the inside edges of the spaced electrodes.

4. The power semiconductor device according to claim 1, wherein said semiconductor device is of a compression-bonded encapsulation-type semiconductor device such that a plurality of electrodes formed in a mesa type structure and a thermal buffer plate are pressed together.

5. The power semiconductor device according to claim 4, wherein the thermal buffer plate is pressed toward the groove through a relatively collapsible cathode electrode.

* * * * *

UNITED STATES PATENT AND TRADEMARK OFFICE
CERTIFICATE OF CORRECTION

PATENT NO. : 4,618,877
DATED : October 21, 1986
INVENTOR(S) : Youichi Araki et al.

It is certified that error appears in the above-identified patent and that said Letters Patent is hereby corrected as shown below:

On the cover page, please change the city in [73] to
-- Kawasaki-shi --

Signed and Sealed this

Tenth Day of March, 1987

Attest:

DONALD J. QUIGG

Attesting Officer

Commissioner of Patents and Trademarks